(12) United States Patent
Carneiro et al.

(10) Patent No.: US 9,979,407 B1
(45) Date of Patent: May 22, 2018

(54) APPARATUS AND METHOD FOR DYNAMICALLY PROVIDING CHARGE

(71) Applicant: Amazon Technologies, Inc., Seattle, WA (US)

(72) Inventors: Steven Ramos Carneiro, Eindhoven (NL); Pavel Novoselov, Eindhoven (NL)

(73) Assignee: Amazon Technologies, Inc., Seattle, WA (US)

( * ) Notice: Subject to any disclaimer, the term of this patent is extended or adjusted under 35 U.S.C. 154(b) by 211 days.

(21) Appl. No.: 14/870,638

(22) Filed: Sep. 30, 2015

(51) Int. Cl.
*G09G 5/00* (2006.01)
*H03L 7/085* (2006.01)
*H03L 7/181* (2006.01)
*G02B 26/00* (2006.01)
*G09G 3/34* (2006.01)
*H03L 7/089* (2006.01)
*H02M 1/42* (2007.01)
*H05B 33/08* (2006.01)
*H02M 7/04* (2006.01)
*H05B 37/02* (2006.01)

(52) U.S. Cl.
CPC ........... *H03L 7/181* (2013.01); *G02B 26/005* (2013.01); *G09G 3/348* (2013.01); *H02M 1/4208* (2013.01); *H02M 7/04* (2013.01); *H03L 7/0891* (2013.01); *H05B 33/086* (2013.01); *H05B 33/0809* (2013.01); *H05B 37/02* (2013.01); *G09G 2310/08* (2013.01); *G09G 2330/02* (2013.01)

(58) Field of Classification Search
CPC .......... G09G 3/3406; G09G 2320/064; G09G 2310/08; G09G 3/348; G09G 2330/02; H03L 7/181; H03L 7/0891; H02M 1/4208; H02M 7/04; H05B 33/0809; H05B 37/02; H05B 33/086; G02B 26/005
USPC ............... 345/212, 213, 211, 174, 204, 691; 331/1 A, 16, 34, 177 R; 307/31; 315/291
See application file for complete search history.

(56) References Cited

U.S. PATENT DOCUMENTS

2010/0078999 A1\* 4/2010 Celenza .................... G06F 1/26
307/31
2015/0277460 A1\* 10/2015 Liu .......................... H03L 7/06
323/280

\* cited by examiner

*Primary Examiner* — Arnold Kinkead
(74) *Attorney, Agent, or Firm* — Brinks Gilson Lione

(57) ABSTRACT

An apparatus includes a current sensor configured to couple to a power source and to sense a present current draw on the power source by a powered device. A voltage converter is coupled to the current sensor. The voltage converter includes an output line configured to couple to the powered device to provide an output charge to the powered device. The voltage converter is configured to adjust the output charge in relation to the sensed present current draw on the power source.

25 Claims, 7 Drawing Sheets

US 9,979,407 B1

APPARATUS AND METHOD FOR DYNAMICALLY PROVIDING CHARGE

BACKGROUND

Electronic devices, and particularly mobile electronic devices including, without limitation, electronic book ("eBook") readers, mobile phones, and laptop computers, typically include one or more power sources, such as batteries or other types of power stores, for example, power cells, electrochemical cells, fuel cells, or other power storage devices. Often, electronic devices can be inefficient in managing charge drawn from the power source and delivered to the electronic device when the load of the electronic device can vary unpredictably. Therefore, an efficient method of managing charge for electronic devices can be particularly beneficial.

BRIEF DESCRIPTION OF THE DRAWINGS

The detailed description is set forth with reference to the accompanying figures. The use of the same reference numbers in different figures indicates similar or identical items or features.

DETAILED DESCRIPTION

Figure 1:
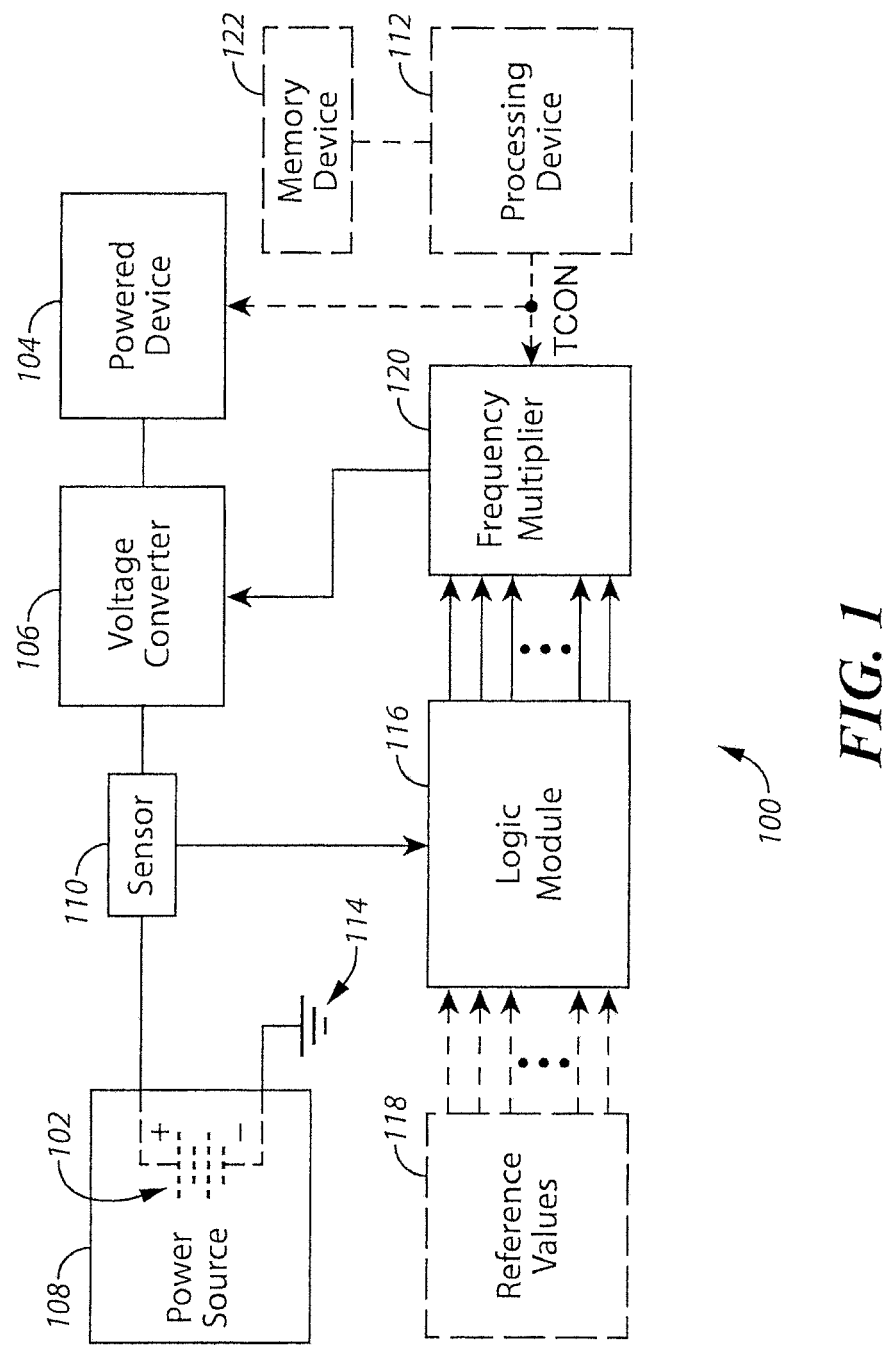
FIG. 1 illustrates an example electronic device including various components of a battery charging system, according to various embodiments.

In various embodiments described herein, an apparatus and associated methods are provided for efficiently providing charge for use by a powered device of an electronic device. The apparatus includes a charge sensor or other power characteristic sensor coupled to the output of a power source (e.g., a battery). In one embodiment, the charge sensor senses a present current draw on the power source by the powered device and/or other components of the electronic device. Based upon that detected current draw, the apparatus controls or adjusts the operation of a voltage converter that transfers charge from the power source to a temporary power store that is used to deliver power to the powered device. By fine-tuning the operation of the voltage converter dynamically based upon current draw or power draw, more efficient charging operation may be achieved.

In certain embodiments, the apparatus adjusts the frequency of a timing control signal based upon a magnitude of detected current draw. That adjusted timing control signal or another signal used in the creation of the adjusted timing control signal can then be supplied to the voltage converter to dictate an amount of output charge supplied to the powered device. In various embodiments, the frequency of the timing control signal is adjusted using a frequency multiplier that increases the frequency (e.g., multiplies the frequency) of the timing control signal by an amount at least partially determined by the current draw on the power source. That increased frequency signal or another signal used in the creation of the adjusted timing control signal is then supplied to the voltage converter, which may be a charge pump in certain embodiments, to dynamically adjust the charge supplied to the powered device. For example, in one embodiment, the increased frequency signal is created using a phase-locked loop ("PLL") to generate a feedback voltage signal to control operation of a voltage controlled oscillator ("VCO"). In this embodiment, the feedback voltage signal is supplied to the voltage converter to dynamically adjust the charge supplied to the powered device.

The various embodiments may be implemented within or provided for use with an electronic device, for example, a mobile device, an e-Book reader, a multimedia system, a communication device, or another electronic device that includes one or more components that are powered by a power source (e.g., a battery). In certain embodiments, a powered device of the electronic device is a display such as an electrowetting display ("EWD") for presenting content and other information.

A standard backlit display panel (e.g., LCD, LED, or plasma panel) may consume a relatively constant amount of power while providing different forms of content (e.g., static text vs. dynamic video). However, in contrast, the power requirements of an EWD may vary greatly dependent upon the present mode of operation of the EWD. Although in some cases an EWD may utilize less power overall than a standard backlit display panel (making the EWD a display type suited for a battery-powered electronic device), the differences in power consumed by the EWD while in different modes of operation (e.g., static text vs. dynamic video) can vary by orders of magnitude. This is primarily due to the way in which an EWD operates. More specifically, an EWD may consume a relatively large amount of energy during an operation to change a displayed image (e.g., when changing a page of text or displaying a dynamic video). Conversely, the EWD consumes a relatively small amount of energy to maintain a display of an image once that image is established (e.g., continuously showing a page of text). Accordingly, the power needs of an EWD can vary widely dependent upon a mode of operation or a refresh rate of the EWD display. Additionally, an EWD may consume different amounts of power when changing a pixel from closed to open than when changing a pixel from open to closed. Thus, the power needs of an EWD can vary based upon the pattern or image being displayed. Because the power needs of an EWD can vary dependent upon the mode of operation, the refresh rate, and/or the pattern being displayed, the power needs of an example electronic device utilizing an EWD can vary at any given moment.

Similarly, electronic devices that use other components in addition to or in lieu of an EWD (e.g., other display types, processors, and telecommunication modules) may also have widely varying power needs at any given moment. For example, an electronic device having a backlit LCD display will consume more power when the display is on than when the display is off. Further, the level of power consumption attributed to the display can vary according to, for example, a brightness setting of the display. Similarly, a communications device may use more power when it is communicating with another electronic device or a service provider than when it is not. Accordingly, the power needs of an electronic device may vary from one moment to another.

Many electronic devices may utilize a charge pump, for example, as a voltage converter, to provide or manage the charge and/or voltage transfer to a powered device from the power source. The charge pump generally transfers small amounts of charge from a power source (e.g., an electronic device's main battery) into a relatively temporary power store (e.g., a capacitor or fuel cell) that, in turn, supplies the charge to the powered device. Typically, the charge pump is operated at a constant or fixed switching frequency using static components (e.g., inductors, resistors, and capacitors that do not change value), resulting in the provision of a fairly constant output voltage or output charge to the powered device. This can result in inefficient charge management as such an approach can waste electric charge, particularly when the immediate power needs of the powered device are relatively low. Certain embodiments may involve dynamically reducing or increasing the charge provided to the powered device in real-time based on the real-time varying needs of the powered device rather than simply providing a constant output charge. By dynamically varying the charge provided to the powered device in direct relation to the present power needs of the powered device, an electronic device according to the present disclosure may reduce inefficiencies by reducing waste of charge (e.g., due to joule effect heating loss) while also providing "charge on demand" when such power is needed.

Turning now to the figures, FIG. 1 illustrates an example electronic device 100 according to various embodiments. In one embodiment, electronic device 100 includes a suitable power source 108, such as a battery 102, coupled to a powered device 104 to provide power ultimately used by powered device 104. In certain embodiments, a voltage converter 106 is also coupled between power source 108 and powered device 104 to provide an output charge and/or an output voltage to be used by powered device 104. For example, voltage converter 106 may receive power from power source 108 which is converted into a voltage and/or a charge suitable for use by powered device 104. A suitable sensor 110 may be provided to sense a present current draw on power source 108 by powered device 104. In one embodiment, the present current draw may be the total charge flowing out of power source 108 to power the entirety of electronic device 100, or, alternatively, may be a charge flowing specifically from power source 108 to powered device 104 (alone or in addition to select other elements of electronic device 100).

Reference is made throughout this disclosure to power source 108, which may include battery 102. However, it should be understood that the term "battery" is not limited in the disclosed embodiments to a battery as a single particular classification of a power source and may be interchangeably used with the term "power store." In some embodiments, the term "battery" may include other types of power stores such as power cells, fuel cells, electrochemical cells, and other power storage devices. In various embodiments, battery 102 is a secondary cell, meaning it is rechargeable. For example, battery 102 may include one or more nickel-cadmium (NiCd) batteries, nickel-zinc (NiZn) batteries, nickel metal hydride (NiMH) batteries, lithium-ion (Li-ion) batteries, lithium polymer batteries, lead-acid batteries, or other known and presently unknown rechargeable battery types. The present disclosure may also be operable with primary cells (non-rechargeable batteries) as well, including for example, zinc-carbon (ZnC) batteries, alkaline batteries, or other known and presently unknown non-rechargeable battery types. Battery 102 may include a single type of battery or may include a mixture of battery types and may include one cell or multiple cells. Battery 102 may include one or more standard cylindrical cells, pouch cells, prismatic cells, button cells, or other known physical power cell configurations. Battery 102 may be included within electronic device 100 (e.g., an integrated rechargeable battery) or provided separately from electronic device 100 (e.g., separate rechargeable or non-rechargeable batteries that are inserted into a battery compartment of the electronic device 100). Battery 102 may be housed fully or partially within electronic device 100 or may be an external component connected to electronic device 100.

In certain embodiments, power source 108 may include externally-sourced power, such as, for example, 120 VAC/60 Hz alternative current ("AC") power from a line voltage source (e.g., a standard wall receptacle). The AC line voltage may be converted to a direct current (DC) through a power supply or an AC-to-DC converter (not shown in FIG. 1), which may be integral with electronic device 100 (e.g., with an internal power supply) or external to electronic device 100 (e.g., with an external "wall-wart" power supply or an in-line brick style power supply). For example, such externally-sourced power may be provided when electronic device 100 is plugged in to operate electronic device 100 and/or to recharge battery 102. Other examples of externally-sourced power include power provided from other batteries (e.g., an automobile battery if electronic device 100 is being powered or charged by an automobile), power generators (e.g., kinetic battery chargers), energy harvesting systems (e.g., solar chargers and wind turbines), and other sources of power external to electronic device 100. Moreover, power source 108 may include a mixture of externally-sourced power and power from battery 102, for example, if battery 102 is being charged by externally-sourced power.

Figure 4:
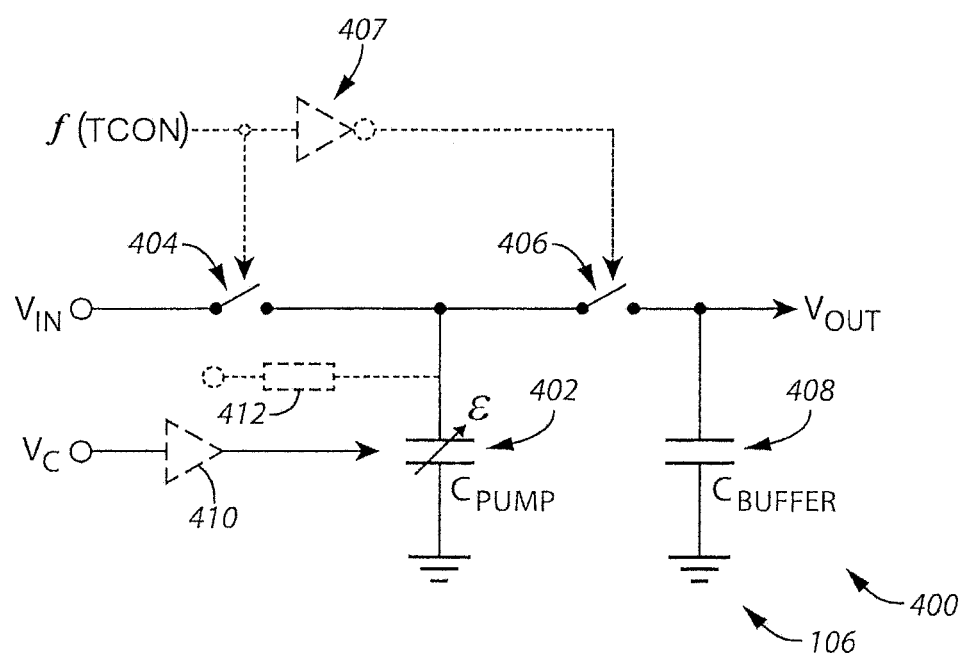
FIG. 4 illustrates an example charge pump implementation of a voltage converter of the electronic device of FIG. 1, according to various embodiments.

In certain embodiments, voltage converter 106 is a direct current to direct current ("DC/DC") voltage converter. Voltage converter 106 receives power from power source 108 and generates a voltage suitable for operation of powered device 104 and/or other portions of electronic device 100. In one approach, voltage converter 106 includes a charge pump 400. An example charge pump 400 is shown in FIG. 4 and is discussed further below. Other voltage converter types are possible.

Powered device 104 may include the entirety of electronic device 100 or one or more portions of electronic device 100. For example, powered device 104 may include a display, and, in one particular embodiment, an electrowetting display (EWD). Other example powered devices 104 include, without limitation, processing devices (such as a processing device 112), memory devices (such as memory device 122), interface devices, lights, touchscreens, user input devices, communication modules, power management modules, audio components, and any other component that may be included as part of electronic device 100.

As discussed above, the power needs of powered device 104 can vary widely during use of electronic device 100. Thus, in accordance with various embodiments, sensor 110 is provided, at least in part, to sense a present current draw by powered device 104 on power source 108. In one embodiment, sensor 110 is a charge sensor that senses a current draw on power source 108 by powered device 104. Such a charge sensor may detect the flow of charge (e.g., current) through a medium or a conductor. In one embodiment, such a charge sensor is implemented with a current sensor that senses a present current draw on power source 108 by powered device 104. In one embodiment, the current sensor may include a resistive element having a small resistance that generates a voltage when current passes therethrough. This generated voltage may or may not be treated by other components in the current sensor or external to the current sensor to amplify the voltage value or to modify the voltage value in a way that is thereafter usable by or better suited for other circuit elements (e.g., comparators 206 in FIG. 2). Many other current sensor designs are possible, however, and the present disclosure is not limited to a resistive element-based current sensor. For example, in certain embodiments, the current sensor may sense the current using other circuitry in accordance with known methods and may output an analog voltage signal corresponding to the current passing through sensor 110 or a digital output representation of the charge or current passing through sensor 110.

In another embodiment, sensor 110 includes a voltage sensor and measures the voltage at the output of power source 108, for example, as compared to ground 114. Sensor 110 can detect voltage drops or variations in voltage that are indicative of the present current draw by powered device 104 on power source 108. Although only charge sensors, current sensors, and voltage sensors are discussed, many other sensor types may be employed to provide feedback as to the present current draw by powered device 104 on power source 108.

In another embodiment, sensor 110 includes a battery monitor configured to detect a present state of battery 102. For example, sensor 110 may detect one or more of the following: an amount of charge presently stored in battery 102, a voltage output by battery 102, a charge or current output by battery 102, a temperature of battery 102, a health of battery 102, a present charge capacity of battery 102, and/or other characteristics of battery 102 indicative of its present state, and particularly, in various embodiments, the present status of its charge. Further, in one embodiment, sensor 110 can indirectly detect the present current draw by powered device 104 on battery 102 by detecting a characteristic of battery 102 and/or by detecting a change in a characteristic of battery 102. For example, sensor 110 can detect the voltage at the output of battery 102, which may be, at least in part, indicative of the present load of powered device 104. Sensor 110 can be configured to output a signal indicative the present state of battery 102. Other variations are possible and are within the scope of the present disclosure.

With continuing reference to FIG. 1, in various embodiments, the output of sensor 110 is coupled to an input of a logic module 116. Logic module 116 receives the output of sensor 110 and translates the received signal into a binary output signal. For example, logic module 116 may compare the sensor output to a plurality of reference values 118 that are each indicative of a different current draw value by powered device 104 on power source 108. Similarly, reference values 118 may each be indicative of a different current draw or power draw by powered device 104 on power source 108. In certain embodiments, reference values 118 are also indicative of a voltage drop value and/or another characteristic reference value indicative of the draw by powered device 104 on power source 108 or a present state of battery 102. Logic module 116 may be implemented in one or more integrated circuits or gate arrays, off-the-shelf semiconductor components such as logic chips, transistors, or other discrete components. Logic module 116 may also be implemented in programmable hardware devices such as field programmable gate arrays, programmable array logic, programmable logic devices or the like.

In a software, firmware, or other digital implementation, reference values 118 may be stored in a memory 122, for example, in a look-up table. Reference values 118 are available for logic module 116 to compare to the received output of sensor 110 existing in a digital form (e.g., received from sensor 110 in a digital form or converted from analog to digital by logic module 116 or another component).

Figure 2:
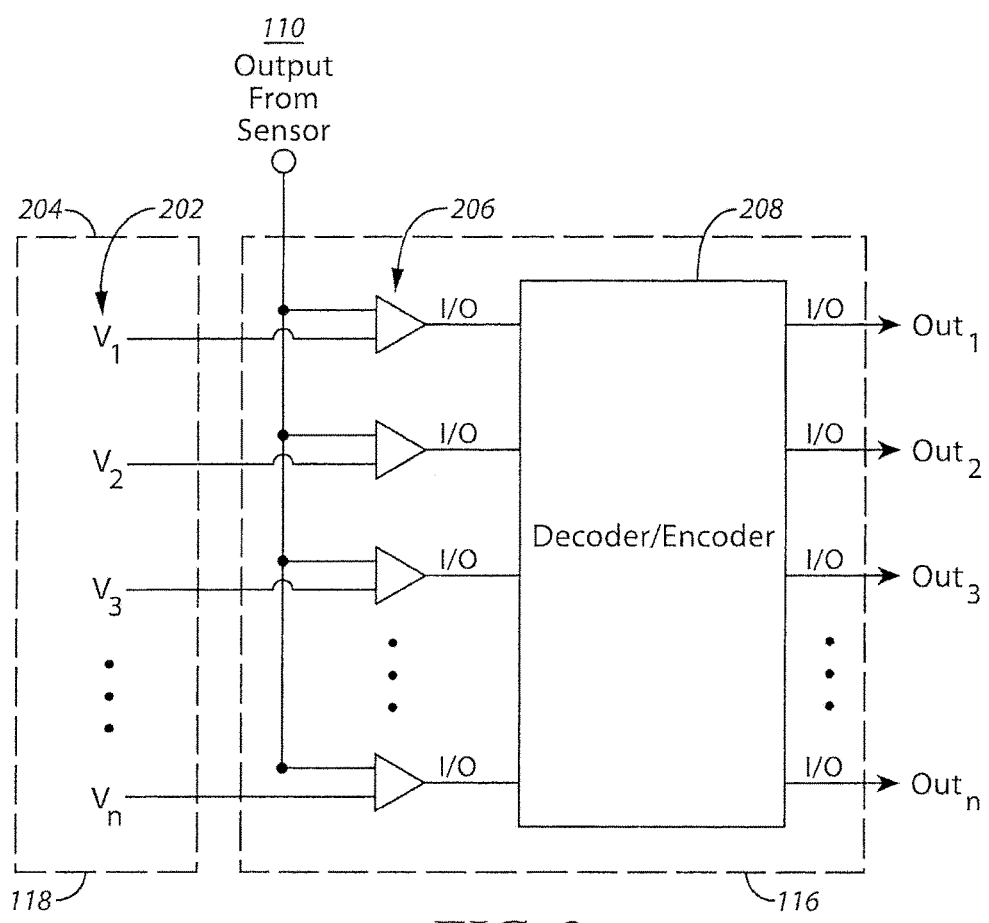
FIG. 2 illustrates an example decoder/encoder logic module of the electronic device of FIG. 1, according to various embodiments.

In another embodiment, reference values 118 are generated as analog signals for analog comparison to an analog output from sensor 110. Referring further to FIG. 2, a diagram of logic module 116 and reference values 118 is illustrated in accordance with various embodiments. Reference values 118 may include a set of reference voltages 202 ($V_1$-$V_n$) that can be generated via any known manner. For example, reference voltages 202 can be created with a resistor divider network, or a diode divider network. Other specialized integrated circuits, power supply modules, or other circuit types may be employed instead to generate the plurality of reference voltages 202. The plurality of reference voltages 202 may include to a range of values of the output signal from sensor 110 that are indicative of a range of acceptable or anticipated current draw levels, current draw levels, or power draw levels on power supply 108 by powered device 104. The range may include an additional margin on either or both ends of the range.

In one embodiment, sensor 110 is a charge sensor that outputs a signal indicative of the present current draw by powered device 104 and $V_1$ corresponds to a voltage of the output signal from sensor 110 at a highest anticipated current draw (e.g., highest current under normal operating conditions and possibly inclusive of an additional margin) that powered device 104 may draw from power source 108. Similarly, $V_n$ corresponds to a voltage of the output signal from sensor 110 at a lowest anticipated current draw (e.g., at or near zero current) that powered device 104 may draw from power source 108. The remainder of the given reference values $V_2$ through $V_{n-1}$ are selected to equally cover intervals of a range of anticipated current draws (e.g., defining n or n+1 different intervals).

In another embodiment, if sensor 110 is a voltage sensor that senses the voltage output of battery 102, then $V_1$ corresponds to a voltage of the output signal from sensor 110 at a lowest anticipated operational voltage level at which powered device 104 or the remainder of electronic device 100 may operate. Similarly, $V_n$ corresponds to the voltage of the output signal from sensor 110 at a highest voltage level that battery 102 can generate or store or the highest voltage level at which powered device 104 can operate (e.g., under normal operating conditions and possibly inclusive of an additional margin). The remainder of the given reference values $V_2$ through $V_{n-1}$ are selected to equally cover intervals of a range of anticipated voltage levels (e.g., defining n different intervals).

In alternative embodiments, reference voltages 202 may correspond to another sensed characteristic output by sensor 110 and can be selected to define an acceptable or operational range corresponding to that sensed characteristic. For example, if sensor 110 is a temperature sensor outputting a voltage corresponding to a sensed temperature, reference voltages 202 may correspond to a range of acceptable temperatures for electronic device 100 and/or battery 102. Many other variations are possible.

In other embodiments, the values of reference voltages 202 are not equally spaced within the range and may instead vary in any number of different linear and non-linear manners. For example, the values of $V_1$ through $V_n$ may be selected in a linear distribution that may include various different linear segments or offsets. Similarly, reference voltages 202 may be selected in a non-linear distribution pattern including exponentially increasing values, logarithmically increasing values, quadratically increasing values, or increasing values of any other simple or complex mathematical relationship. These relationships may be defined to increase granular resolution at certain portions of the range or at particular segments of the range. Further, these relationships may be defined to compensate for or accommodate a characteristic of the output signal of sensor 110 (e.g., to accommodate a non-linear output if sensor 110 outputs a non-linear output signal). In other embodiments, reference voltages 202 may be selected according to a particular need of a specific electronic device 100 or powered device 104. As such, a designer can select the particular values of reference voltages 202 for the specific portions of a range of a sensed characteristic according to the needs of that system.

Still in other embodiments, the values of $V_1$ through $V_n$ may be dynamically selected, for example, based upon a particular operational status of powered device 104. In a non-limiting example, if powered device 104 is an EWD having multiple operational modes (e.g., a text mode with a relatively low current draw and a video mode with a relatively high current draw), the values of $V_1$ through $V_n$ may be selected dynamically dependent upon the particular mode of operation. For example, if a reference voltage generator 204 that generates the reference voltage values $V_1$ through $V_n$ detects or is informed that the EWD is presently operating in a text mode (low current draw), reference voltage generator 204 may adjust all or some of the voltages $V_1$ through $V_n$ to focus on a particular segment of the range, for example, a low current draw end of the range. If, however, reference voltage generator 204 detects or is informed that the EWD is presently operating in a video mode (high current draw), reference voltage generator 204 may adjust all or some of the voltages $V_1$ through $V_n$ to focus on a different segment of the range, for example, a higher current draw end of the range. In various embodiments, reference voltage generator 204 or another module may monitor a frequency of an operational control signal (e.g., a TCON signal, discussed below) to determine that the operational control signal has a low frequency or a high frequency, thereby informing reference voltage generator 204 or other modules of electronic device 100 that the EWD is operating in a text mode or a video mode, respectively.

With continued reference to FIG. 2, and in accordance with various embodiments, logic module 116 includes a plurality of comparator 206 that each receives the output from sensor 110 at one input. Each comparator 206 also receives a different one of reference voltages 202 at its respective second input. Each comparator 206 then compares the two input voltage values and outputs a logic 1 or 0 dependent upon whether the voltage of the output from sensor 110 is higher or lower than the particular compared reference voltage 202. Thus, in one example, if the voltage value of the sensor output is greater than the voltage $V_5$ but is less than the voltage $V_4$, then the comparators associated with $V_5$ through $V_n$ will output a logic 1 while the comparators associated with $V_1$ through $V_4$ will output a logic 0 (with an output for $V_1$ through $V_n$ reading as 00001111 for n=8).

The outputs of comparator 206 are each coupled to an input of a decoder/encoder 208. In one embodiment, decoder/encoder 208 is a logical decoder (e.g., a 3-to-8 or 4-to-8 logic decoder) that receives a binary input, here, the outputs of comparator 206, and selects one output (e.g., one output of $out_1$ through $out_n$) based on the received binary input. The selected output then outputs a logic 1 while the remainder of the outputs provide a logic 0.

In another embodiment, decoder/encoder 208 is a priority logic module (for example, an 8-to-8 priority logic module or an 8-to-3 or 8-to-4 priority encoder) that receives at each of its inputs an output from a different comparator 206. The priority logic module outputs a signal (e.g., by asserting individual binary outputs or by outputting a binary coded decimal ("BCD") output) corresponding to the highest-significant bit input having a logic 1.

So configured, logic module 116, in combination with reference values 118, outputs a binary code corresponding to a discrete value of a present characteristic of either powered device 104 or power source 108. For example, the binary output code may correspond to a discrete value of a present current draw, a present power draw, a present current draw, or a present voltage drop effected by powered device 104 on power source 108. Alternatively, the binary output code may correspond to a discrete value of a present value of a voltage output of power source 102 or an available charge at power source 102. As discussed above, the binary output code may correspond to any number of different discrete values associated with the characteristic sensed by sensor 110.

Referring again to FIG. 1, electronic device 100 further includes a frequency multiplier 120. Frequency multiplier 120 receives the output signals (e.g., $out_1$ through $out_n$) from logic module 116. In one embodiment, frequency multiplier 120 also receives from a processing device 112 or another suitable device, such as powered device 104, a timing control signal (TCON) indicative of the present operational frequency of powered device 104. The timing control signal may also be considered a frequency signal indicative of the present operational frequency of powered device 104.

Figure 3:
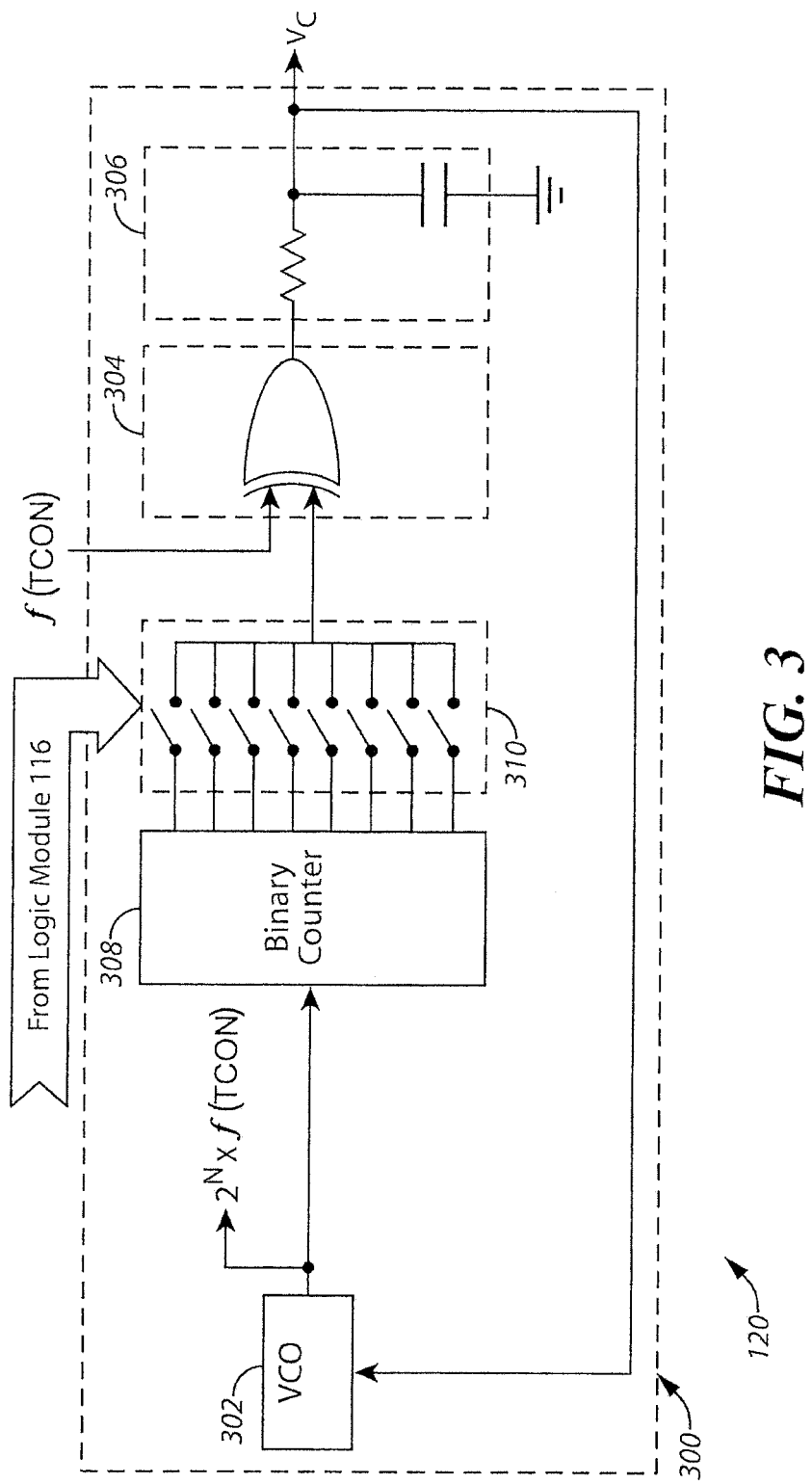
FIG. 3 illustrates an example frequency multiplier of the electronic device of FIG. 1, according to various embodiments.

Turning now to FIG. 3, an example frequency multiplier 120 is illustrated in accordance with various embodiments. In various embodiments, the frequency multiplier 120 increases the frequency of a control signal or a frequency signal (e.g., TCON) by an amount at least partially determined by a value corresponding to the present current draw on the power source 108 to create an increased frequency signal. In various embodiments, increasing the frequency comprises multiplying the frequency by a factor corresponding to the sensed present current draw to generate a multiplied frequency signal. In the depicted embodiment, the frequency multiplier 120 includes a phase-locked loop ("PLL") 300 including a voltage controlled oscillator ("VCO") 302, a phase detector 304, and a low-pass filter 306. In the depicted embodiment, phase detector 304 is implemented with a logic exclusive-OR ("XOR") gate and low-pass filter 306 is implemented with a resistor and a low pass filter capacitor, the values of which are tuned to an appropriate low-pass frequency. The output line of low-pass filter 306, labeled $V_C$, is returned to the input line of VCO 302 to control the frequency of the oscillating output signal generated by VCO 302 on the VCO output line. The signal $V_C$ is a feedback voltage signal and is made relatively stable by operation of low-pass filter 306 so as to be suitable for feeding back to VCO 302.

In this embodiment, PLL 300 is modified to also include a binary counter 308 and a selector 310. However, in the absence of binary counter 308 and selector 310, PLL 300 may operate as a standard PLL. The operation of such a standard PLL is briefly described first, followed by a description of how the modifications including binary counter 308 and selector 310 implement a frequency multiplication function.

In a standard PLL configuration, the output line of VCO 302 connects to the second input line of phase detector 304, while the first input line of phase detector 304 receives the TCON signal. In such a configuration, and in accordance with typical PLL behavior and design, the output line of phase detector 304 includes a phase signal that is high whenever its two oscillating inputs are out of phase. During steady state operation (e.g., where the frequency generated by VCO 302 is "locked" to the frequency of TCON), the output line of phase detector 304 includes a repeating periodic signal having a particular duty cycle percentage. The phase signal is passed into the input line of low pass filter 306 and is filtered to create a relatively steady voltage signal, here labeled $V_C$, that is dependent upon the duty cycle of the phase signal. The signal $V_C$ is used as a feedback signal that is sent back to the input of VCO 302 to control the frequency of the oscillating output signal on the output line of VCO 302. When PLL 300 is at steady state operation, the two input signals on the two input lines of phase detector 304 (TCON and the output signal on the output line of VCO 302) will be locked in frequency, but offset by a certain phase. The higher the reference frequency (TCON), the higher the phase offset that is required between the two input signals to generate a higher low-pass filter output line $V_C$, to thereby generate a higher frequency signal on the VCO output line from VCO 302.

When binary counter 308 and selector 310 are added into PLL 300, as shown in FIG. 3, the result is a frequency multiplier. Binary counter 308 increments a BCD value output on its output lines or pins (here, showing eight output lines for a total of 256 possible BCD values) with every clock pulse binary counter 308 receives on a clock input pulse pin. In this embodiment, the output line of VCO 302 is coupled to the clock input pulse line such that the BCD output of binary counter 308 increments by one with every oscillation of the output signal from VCO 302. In this manner, the first output line of binary counter 308, being the least-significant bit, will change its state from logic 0 to logic 1 and vice versa (e.g., "oscillate") half as fast as the output line of VCO 302. The second output line will oscillate one-quarter as fast as the output line of the VCO 302. The third output line will oscillate one-eighth as fast as the output of the VCO 302, and so forth. Because the output of binary counter 308 is BCD binary, the relationship between the oscillation frequency of each individual output line and the frequency of the output of VCO 302 is $f(N)=f(VCO)\times 2^{-N}$, where N is the particular BCD output line (starting with 1 as the least-significant output bit).

Selector 310 operates by coupling one of the BCD output lines (e.g., the selected $N^{th}$ output line) of binary counter 308 to the second input line of phase detector 304. Selector 310 may include a mux receiving on one or more input lines BCD inputs from logic module 116. In another embodiment, an array of logic AND gates can be used with one input line coupled to one output line of counter 308 and the other coupled to selected output lines from logic module 116. Other logical devices and circuits may be used to implement the selection function of selector 310 as a function of signals from logic module 116.

For example, if N=1 and the first BCD output line of binary counter 308 is selected, the signal sent into phase detection 304 will oscillate at half the frequency as the output signal on the output line of VCO 302. Because PLL 300 is configured to match the frequencies of the two input signals sent into the input lines of phase detector 304 (e.g., to "lock" the frequencies of the two signals), PLL 300 will increase the VCO oscillation frequency to be twice as fast as the frequency of TCON ("f(TCON)") so that the output frequency of the first BCD output line of binary counter 308 matches f(TCON). Thus, VCO 302 has multiplied f(TCON) by two. Similarly, if for example N=2 and the second BCD output line of binary counter 308 is selected, the signal sent into phase detector 304 will be oscillating at one-fourth the frequency as the output signal on the output line of VCO 302. PLL 300 will increase the VCO oscillation frequency to be four-times as fast as f(TCON) so that the output frequency of the second BCD output line of binary counter 308 matches f(TCON). Thus, VCO 302 has multiplied f(TCON) by four. Accordingly, the relationship between the multiplied frequency is $2^N \times f(TCON)$, as is illustrated in FIG. 3.

The selection of the particular BCD output line of binary counter 308 is determined by the signals on the output lines of logic module 116, discussed above. Accordingly, in one example, when a particularly low current draw by powered device 104 is sensed by sensor 110, the multiplication factor N for the multiplied frequency signal may remain relatively low. Conversely, when a particular high current draw is sensed, the multiplication factor N may increase. Similarly, when a particularly low voltage at the output of power source 108 is sensed by sensor 110 (implying a low-charge on battery 102 or an increased current draw by powered device 104), the multiplication factor N for the multiplied frequency signal may remain high. Conversely, when a particular high voltage at the output of power source 108 is sensed, the multiplication factor N may decrease. As is discussed below, the multiplication factor N for the multiplied frequency signal has a direct impact on the available charge, voltage, or current output by voltage converter 106 on output line $V_{OUT}$ for use by powered device 104.

To increase the VCO output frequency, the value of the feedback voltage $V_C$ must increase. Accordingly, with every increase in the multiplication factor N, the value of $V_C$ increases. Additionally, because the timing control signal TCON can change from one moment to the next, for example, dependent on an operational mode of powered device 104 (e.g., an EWD), and because the frequency of TCON, f(TCON), is a primary driving factor of the operation of PLL 300, the value of $V_C$ is also tied to the present operational frequency of powered device 104. In various embodiments, the increasing or decreasing feedback voltage signal $V_C$ can then be used by other components to influence the amount of voltage and/or charge available at the output line of voltage converter 106.

In one embodiment, VCO 302 is an exponentially increasing VCO, having an exponentially increasing relationship between input voltage and generated output oscillation frequency. Such an approach would allow for linear (or a more linear) voltage level changes for the feedback voltage $V_C$ with each increasing multiplication factor N. This is because the exponentially increasing relationship of VCO 302 offsets the exponentially increasing relationship of the BCD output lines of binary counter 308.

Turning now to FIG. 4, an example voltage converter 106 is illustrated in accordance with various embodiments. In one embodiment, voltage converter 106 is charge pump 400 including a flying capacitor 402 ($C_{PUMP}$) having one end coupled to ground and the other end coupled to two switches, a first switch 404 and a second switch 406. First switch 404 and second switch 406 may be mechanical switches, such as relays, or transistors such as, for example, field-effect transistors ("FETs"), metal-oxide-semiconductor FETs ("MOSFETs"), junction gate FETs ("JFETs"), or other transistor types. First switch 404 selectively connects flying capacitor 402 to $V_{IN}$ (which is coupled to and receives power from power source 108 in FIG. 1 via an input line, possibly through sensor 110 or another device), while second switch 406 selectively connects flying capacitor 402 to $V_{OUT}$ (which is connected to the powered device 104 through an output line). First switch 404 and second switch 406 operate in opposite phases such that first switch 404 is disconnected when second switch 406 is connected, and vice versa. In one embodiment, an inverter 407 or a similar device implements the opposite phase switching. In one embodiment, first switch 404 and second switch 406 are controlled by a constant or fixed frequency. In another embodiment, first switch 404 and second switch 406 are controlled by the timing signal TCON, as is shown in FIG. 4. In another embodiment, first switch 404 and second switch 406 are controlled by the multiplied frequency signal ($2^N \times f(TCON)$) output by VCO 302 in frequency multiplier 120. Charge pump 400 also includes a buffer capacitor 408 ($C_{BUFFER}$).

In operation, during a first phase, flying capacitor 402 is connected to the $V_{IN}$ input line via first switch 404 and receives charge from $V_{IN}$ (e.g., from power source 108). Also, during the first phase, the charge stored in buffer capacitor 408 is provided out to $V_{OUT}$. In a second phase, flying capacitor 402 is connected to the $V_{OUT}$ output line through second switch 406 while first switch 404 is opened. Flying capacitor 402 provides the stored charge from the first phase to $V_{OUT}$ and to refill the charge in buffer capacitor 408. The process then returns to the first phase and continuously repeats. Various other charge pump designs are possible, including the use of a single switch or additional switches to implement the switching circuit.

In one embodiment, flying capacitor 402 is an adjustable flying capacitor, for example, a voltage controlled capacitor (e.g., a varactor or a varicap) whose capacitance value is controlled by an incoming voltage, here being the feedback voltage signal $V_C$ generated by frequency multiplier 120 (see FIG. 3) and provided to the charge pump 400 on an input line operatively coupled to the frequency multiplier 120. Accordingly, the capacitance value of flying capacitor 402 can be changed dynamically and in real-time based on a combination of the selected multiplication factor N (e.g., selected based on a present power draw on power source 108 or a status of power source 108 or battery 102) and the real-time operation of powered device 104 (via the timing control signal TCON). As with VCO 302, discussed above, the relationship between the voltage feedback signal $V_C$ and the resulting capacitance of flying capacitor 402 may be linear or exponential. In certain embodiments, a voltage controlled capacitor implementation is utilized because the voltage controlled capacitor is typically more flexible and robust. However, other voltage controlled elements (e.g., resistors or inductors) may be utilized instead in various other charge pump approaches and designs.

An amplifier 410 or other circuitry may be included to alter the value of the voltage feedback signal $V_C$ as needed for proper operation with the voltage controlled flying capacitor 402. In another embodiment, a resistor 412 or a similar device having a high resistance value (e.g., 100K Ohms, 1M Ohms, or another suitable value) or may provide a slow trickle of charge via $V_{IN}$ from power source 108 to buffer capacitor 408 and/or powered device 104 through $V_{OUT}$ to account for charge leakage (e.g., capacitive charge leakage from flying capacitor 402, buffer capacitor 408, powered device 104, or other leakage sources) or other small current draws. For example, if first switch 404 and second switch 406 are controlled by the control signal TCON and when there is minimal activity on the control signal TCON (e.g., corresponding to a low or zero refresh rate, for example, while providing a static page of text on an EWD), charge pump 400 may remain in the second phase state (switch 404 open and switch 406 closed). To prevent total depletion of the charge in buffer capacitor 408 due to charge leakages, resistor 412 may provide the trickle of charge, as discussed above.

Accordingly, in one embodiment, operation of charge pump 400 can be described with the following equation:

$$V_{OUT} = \beta(V_C) \times V_{IN},$$

wherein $\beta(V_C)$ is a gain factor associated with the signal $V_C$. As is discussed above, factors that can influence $\beta(V_C)$ include the present current draw on power supply 108, the frequency of the control signal TCON, the present operational mode of powered device 104, selection of the values of the various components in charge pump 400 and/or other components, and/or other factors. Thus, charge pump 400 can dynamically adjust the output voltage and/or the amount of charge available at the output line $V_{OUT}$ for use by powered device 104 based on the real-time operation of powered device 104 (indicated by TCON) and also based on the real-time charge/power/current draw on power source 108, a combination of which is conveyed in the feedback voltage signal $V_C$. In certain embodiments, controlling first switch 402 and second switch 404 with the control signal TCON furthers the connection between the amount of output charge available at the output line $V_{OUT}$ and the real-time operation of powered device 104.

By dynamically adjusting the output voltage or the available output charge of charge pump 400 at its output line $V_{OUT}$ according to a present current draw, electronic device 100 efficiently provides power for powered device 104 by reducing wasted charge that may otherwise be generated by a fixed frequency and/or a fixed output charge pump due to, for example, parasitic resistances or capacitances in the charge pump. Further, such an approach also produces less strain on the underlying electrics and/or power source 108, and specifically, battery 102 if utilized, thereby increasing the life span of electronic device 100 by reducing the amount of generated heat (e.g., due to the Joule heating effect) and reducing electrical overload of power source 108, battery 102, and/or other components of electronic device 100. The increases in efficiency may be provided while also providing the flexibility to adapt to the real-time load of powered device 104.

As mentioned above, powered device 104 of electronic device 100 may include an electrowetting display EWD in various embodiments. An electrowetting display device, may be a transmissive, reflective or transflective display that generally includes an array of pixels (e.g., which may comprise subpixels) configured to be operated by an active matrix addressing scheme. For example, rows and columns of electrowetting pixels are operated by controlling voltage levels on a plurality of source lines and gate lines. In this fashion, the display device may produce an image by selecting particular pixels to transmit, reflect or block light. Pixels are addressed (e.g., selected) via rows and columns of the source lines and the gate lines that are electrically connected to transistors (e.g., used as switches) included in each pixel.

An electrowetting pixel is defined by a number of pixel walls that surround or are otherwise associated with at least a portion of the electrowetting pixel. The pixel walls form a structure that is configured to contain at least a portion of a first liquid, such as an opaque oil. Light transmission through the electrowetting pixel can then be controlled by the application of an electric potential to the electrowetting pixel, which results in a movement of a second liquid, such as an electrolyte solution, into the electrowetting pixel, thereby displacing the first liquid.

When the electrowetting pixel is in a rest state (i.e., with no electric potential applied), the opaque oil is distributed throughout the pixel. The oil absorbs light and the pixel in this condition appears black. But when an electric potential is applied to the pixel, the oil is displaced to one side of the pixel. Light can then enter the pixel striking a reflective surface. The light then reflects out of the pixel, causing the pixel to appear white to an observer. If the reflective surface only reflects a portion of the light spectrum or if light filters are incorporated into the pixel structure, this may cause the pixel to have color.

In some examples, the electronic devices may include one or more components associated with the electrowetting display, such as a touch sensor component layered atop the electrowetting display for detecting touch inputs, a front light or back light component for lighting the electrowetting display, and/or a cover layer component, which may include antiglare properties, antireflective properties, anti-fingerprint properties, anti-cracking properties, and the like.

In some embodiments, a display device as described herein may include a portion of a system that includes one or more processors, for example processing device 112, and one or more computer memory devices 122, which may reside on a control board, for example. Display software may be stored on the one or more memory devices 122 and may be operable with the one or more processors to modulate light that is received from an outside source (e.g., ambient room light) or out-coupled from a lightguide of the display device. For example, display software may include code executable by a processor to modulate optical properties of individual pixels of the electrowetting display based, at least in part, on electronic signals representative of image and/or video data. The code may cause the processor to modulate the optical properties of pixels by controlling electrical signals (e.g., voltages, currents, and fields) on, over, and/or in layers of the electrowetting display.

Electronic device 100 may have additional features or functionality. For example, electronic device 100 may also include additional data storage devices (removable and/or non-removable) such as, for example, magnetic disks, optical disks, or tape. The additional data storage media, which may reside in a control board, may include volatile and nonvolatile, removable and non-removable media implemented in any method or technology for storage of information, such as computer readable instructions, data structures, program modules, or other data. In addition, some or all of the functionality described as residing within electronic device 100 may reside remotely from electronic device 100 in some implementations. In these implementations, electronic device 100 may utilize communication interfaces to communicate with and utilize this functionality.

Figure 5:
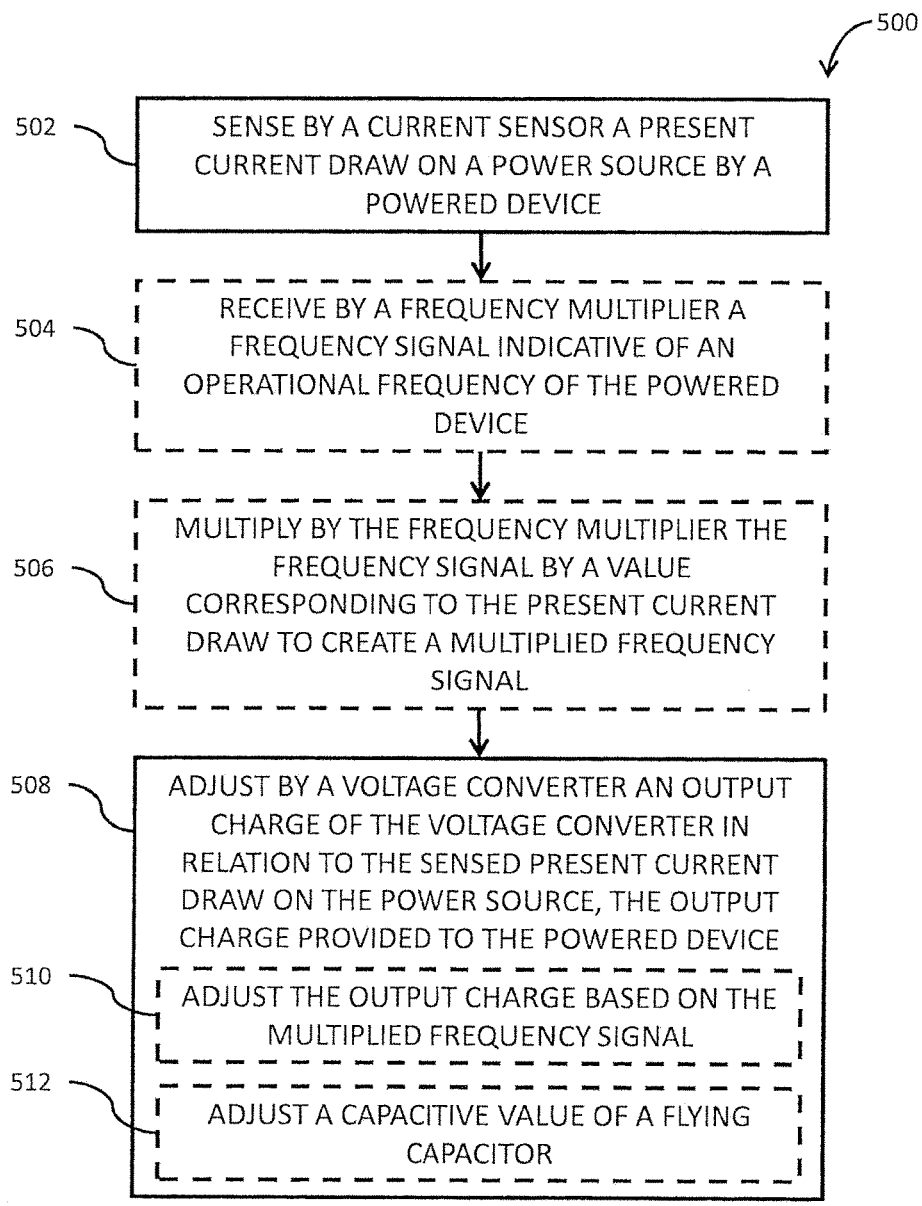
FIG. 5 illustrates a flow diagram of an example method for use with the battery charging system, in accordance with various embodiments.

FIG. 5 illustrates an example method 500 for use with the above described systems in accordance with various embodiments. At step 502, sensor 110, for example, a charge sensor, current sensor, voltage sensor, or other sensor type, senses a present current draw or power draw on a power source 108 (e.g., battery 102 or another power store) by powered device 104. Optionally, at step 504, frequency multiplier 120 receives a frequency signal indicative of an operational frequency of powered device 104. In one embodiment, the frequency signal is a timing control signal, for example, TCON, discussed above. Optionally, at step 506, frequency multiplier 120 multiplies the frequency signal by a value corresponding to the present current draw to create a multiplied frequency signal. At step 508, voltage converter 106 adjusts an output charge or an output voltage of voltage converter 106 in relation to the sensed present current draw (or power draw) on power source 108. The output charge is provided on its output line for use by powered device 104. In a particular embodiment, at step 510, voltage converter 106 adjusts the output charge based on the multiplied frequency signal, for example, as generated in step 506 above. In another particular embodiment, at step 512, voltage converter 106 adjusts a capacitive value of flying capacitor 402 of charge pump 400.

Figure 6:
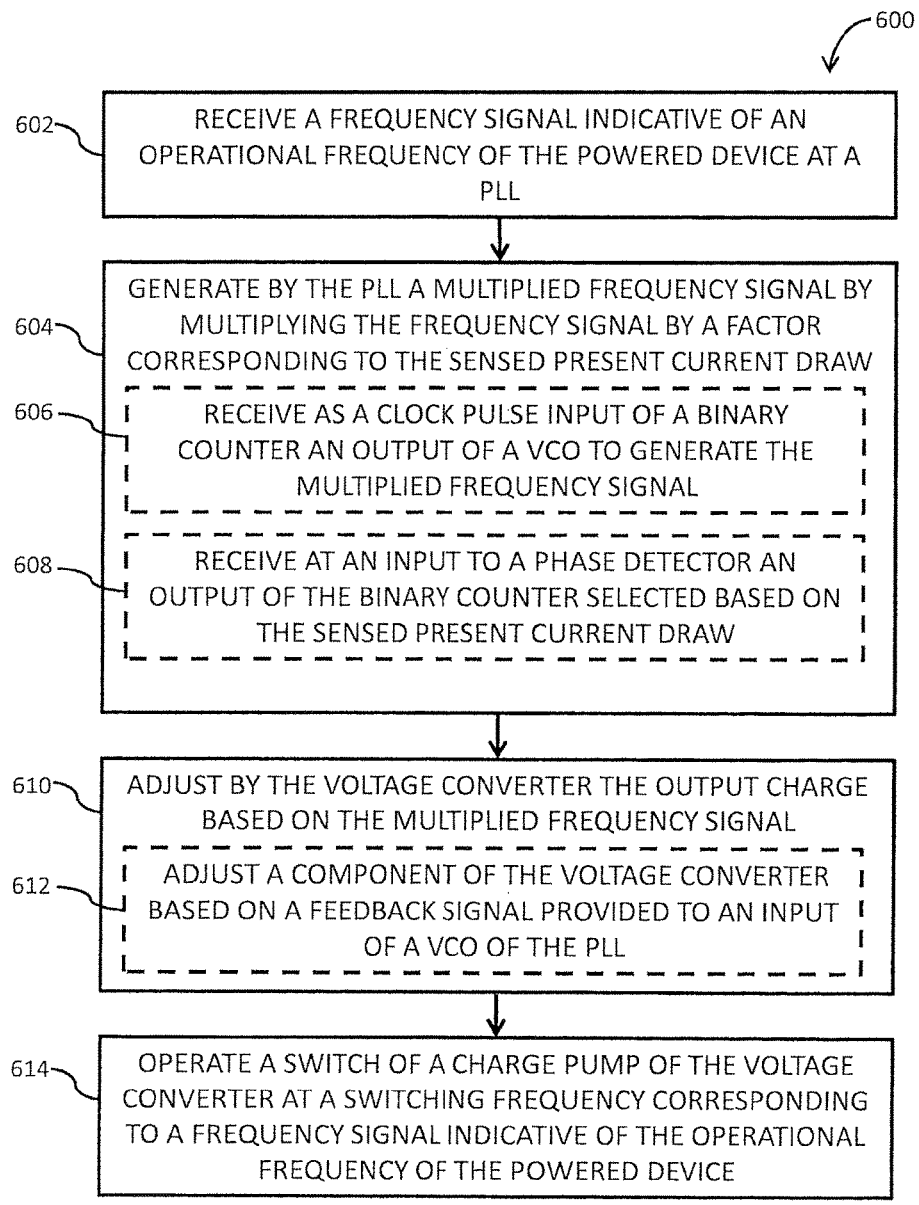
FIG. 6 illustrates a flow diagram of an alternative example method for use with the battery charging system, in accordance with various embodiments.

Referring now to FIG. 6, an alternative example method 600 is illustrated in accordance with various embodiments. Method 600 may supplement all or portions of method 500 of FIG. 5, or may exist as a separate method entirely. At step 602, PLL 300 receives the frequency signal indicative of an operational frequency of powered device 104. As mentioned above with respect to step 504, the frequency signal may be a timing control signal, for example, TCON. At step 604, PLL 300 generates a multiplied frequency signal by multiplying the frequency signal by a factor corresponding to the sensed present current draw. Generation of the multiplied frequency signal is discussed above in one embodiment with respect to FIG. 3. At optional step 606, to generate the multiplied frequency signal, binary counter 308 receives as a clock pulse input line an output of VCO 302 and, at step 608, phase detector 304 receives at an input and output of binary counter 308 selected based on the sensed present current draw. At step 610, voltage converter 106 adjusts the output charge or the output voltage based on the multiplied frequency signal, which may include, in one embodiment, voltage converter 106 adjusting the output charge or the output voltage based on the PLL feedback signal provided to an input of VCO 302 (for example, though gain adjustment amplifier 410 or another component). At optional step 612, the output charge or the output charge or voltage is adjusted by adjusting a component of voltage converter 106 based on the feedback signal (e.g., PLL feedback signal) provided to an input of VCO 302. As mentioned above, in one embodiment, the component that is adjusted is a voltage controlled capacitor operating as flying capacitor 402 of charge pump 400.

At optional step 614, a switch (e.g., either or both of first switch 404 and second switch 406) of charge pump 400 of voltage converter 106 is operated at a switching frequency corresponding to the frequency signal indicative of the operational frequency of powered device 104 (e.g., the TCON signal). The switching frequency may be f(TCON), the multiplied frequency signal (e.g., $2^N \times f(TCON)$), or some other switching frequency related to the frequency of TCON.

Figure 7:
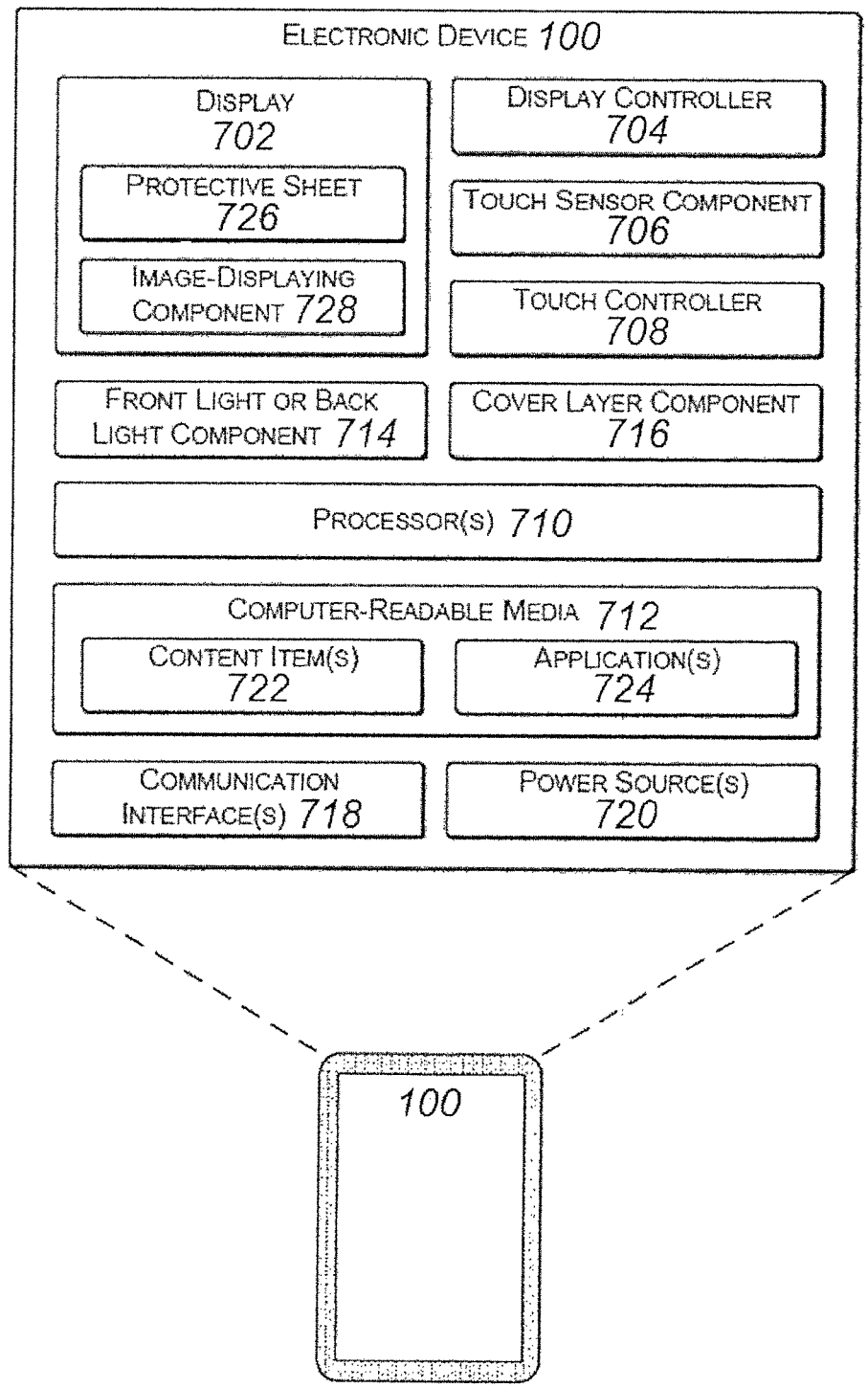
FIG. 7 illustrates an example electronic device that may incorporate a display device, according to various embodiments.

FIG. 7 illustrates an example electronic device 100 that may incorporate any of the elements. Electronic device 100 may comprise any type of electronic device having a display. For instance, electronic device 100 may be a mobile electronic device (e.g., an electronic book reader, a tablet computing device, a laptop computer, a smart phone or other multifunction communication device, a portable digital assistant, a wearable computing device, or an automotive display). Alternatively, electronic device 100 may be a non-mobile electronic device (e.g., a computer display or a television). In addition, while FIG. 7 illustrates several example components of electronic device 100, it is to be appreciated that electronic device 100 may also include other conventional components, such as an operating system, system busses, input/output components, and the like. Further, in other embodiments, such as in the case of a television or computer monitor, electronic device 100 may only include a subset of the components illustrated.

Regardless of the specific implementation of electronic device 100, electronic device 100 may include a display 702 and a corresponding display controller 704. Display 702 may represent a reflective or transmissive display in some instances or, alternatively, a transflective display (partially transmissive and partially reflective). Display 702 may correspond to powered device 104 shown in FIG. 1.

In one embodiment, display 702 comprises an electrowetting display that employs an applied voltage to change the surface tension of a fluid in relation to a surface. For example, such an electrowetting display may include the array of sub-pixels, though claimed subject matter is not limited in this respect. By applying a voltage across a portion of an electrowetting pixel of an electrowetting display, wetting properties of a surface may be modified so that the surface becomes increasingly hydrophilic. As one example of an electrowetting display, the modification of the surface tension acts as an optical switch by displacing a colored oil film if a voltage is applied to individual pixels of the display. If the voltage is absent, the colored oil forms a continuous film within a pixel, and the color may thus be visible to a user. On the other hand, if the voltage is applied to the sub-pixel, the colored oil is displaced and the sub-pixel becomes transparent. If multiple sub-pixels of the display are independently activated, display 702 may present a color or grayscale image. The sub-pixels may form the basis for a transmissive, reflective, or transmissive/reflective (transreflective) display. Further, the sub-pixels may be responsive to high switching speeds (e.g., on the order of several milliseconds), while employing small sub-pixel dimensions. Accordingly, the electrowetting displays herein may be suitable for applications such as displaying video or other animated content.

Of course, while several different examples have been given, it is to be appreciated that while some of the examples described above are discussed as rendering black, white, and varying shades of gray, it is to be appreciated that the described techniques apply equally to reflective displays capable of rendering color pixels. As such, the terms "white," "gray," and "black" may refer to varying degrees of color in implementations utilizing color displays. For instance, where a pixel includes a red color filter, a "gray" value of the pixel may correspond to a shade of pink while a "black" value of the pixel may correspond to a darkest red of the color filter. Furthermore, while some examples herein are described in the environment of a reflective display, in other examples, display 702 may represent a backlit display.

In addition to including display 702, FIG. 7 illustrates that some examples of electronic device 100 may include a touch sensor component 706 and a touch controller 708. In some instances, at least one touch sensor component 706 resides with, or is stacked on, display 702 to form a touch-sensitive display. Thus, display 702 may be capable of both accepting user touch input and rendering content in response to or corresponding to the touch input. As several examples, touch sensor component 706 may comprise a capacitive touch sensor, a force sensitive resistance (FSR), an interpolating force sensitive resistance (IFSR) sensor, or any other type of touch sensor. In some instances, touch sensor component 706 is capable of detecting touches as well as determining an amount of pressure or force of these touches.

FIG. 7 further illustrates that electronic device 100 may include one or more processors 710 (which may correspond to processing device 112 illustrated in FIG. 1) and one or more computer-readable media 712, as well as a front light component 714 (which may alternatively be a backlight component in the case of a backlit display) for lighting display 702, a cover layer component 716, such as a cover glass or cover sheet, one or more communication interfaces 718 and one or more power sources 720. Communication interfaces 718 may support both wired and wireless connection to various networks, such as cellular networks, radio, WiFi networks, short range networks (e.g., Bluetooth® technology), and infrared (IR) networks, for example.

Depending on the configuration of electronic device 100, computer-readable media 712 (and other computer-readable media described throughout) is an example of computer storage media and may include volatile and nonvolatile memory. Thus, computer-readable media 712 may include, without limitation, RAM, ROM, EEPROM, flash memory, and/or other memory technology, and/or any other suitable medium that may be used to store computer-readable instructions, programs, applications, media items, and/or data which may be accessed by electronic device 100. In one embodiment, computer-readable media 712 may include memory device 122 shown in FIG. 1.

Computer-readable media 712 may be used to store any number of functional components that are executable on processor 710, as well as content items 722 and applications 724. Thus, computer-readable media 712 may include an operating system and a storage database to store one or more content items 722, such as eBooks, audio books, songs, videos, still images, and the like. Computer-readable media 712 of electronic device 100 may also store one or more content presentation applications to render content items on electronic device 100. These content presentation applications may be implemented as various applications 724 depending upon content items 722. For instance, the content presentation application may be an electronic book reader application for rendering textual electronic books, an audio player for playing audio books or songs, or a video player for playing video.

In some instances, electronic device 100 may couple to a cover (not illustrated in FIG. 7) to protect display 702 (and other components in the display stack or display assembly) of electronic device 100. In one example, the cover may include a back flap that covers a back portion of electronic device 100 and a front flap that covers display 702 and the other components in the stack. Electronic device 100 and/or the cover may include a sensor (e.g., a Hall effect sensor) to detect whether the cover is open (i.e., if the front flap is not atop display 702 and other components). The sensor may send a signal to front light component 714 if the cover is open and, in response, front light component 714 may illuminate display 702. If the cover is closed, meanwhile, front light component 714 may receive a signal indicating that the cover has closed and, in response, front light component 714 may turn off.

Furthermore, the amount of light emitted by front light component 714 may vary. For instance, upon a user opening the cover, the light from the front light may gradually increase to its full illumination. In some instances, electronic device 100 includes an ambient light sensor (not illustrated in FIG. 7) and the amount of illumination of front light component 714 may be based at least in part on the amount of ambient light detected by the ambient light sensor. For example, front light component 714 may be dimmer if the ambient light sensor detects relatively little ambient light, such as in a dark room; may be brighter if the ambient light sensor detects ambient light within a particular range; and may be dimmer or turned off if the ambient light sensor detects a relatively large amount of ambient light, such as direct sunlight.

In addition, the settings of display 702 may vary depending on whether front light component 714 is on or off, or based on the amount of light provided by front light component 714. For instance, electronic device 100 may implement a larger default font or a greater contrast when the light is off compared to when the light is on. In some embodiments, electronic device 100 maintains, if the light is on, a contrast ratio for display 702 that is within a certain defined percentage of the contrast ratio if the light is off.

As described above, touch sensor component 706 may comprise a capacitive touch sensor that resides atop display 702. In some examples, touch sensor component 706 may be formed on or integrated with cover layer component 716. In other examples, touch sensor component 706 may be a separate component in the stack of the display assembly. Front light component 714 may reside atop or below touch sensor component 706. In some instances, either touch sensor component 706 or front light component 714 is coupled to a top surface of a protective sheet 726 of display 702. As one example, front light component 714 may include a lightguide sheet and a light source (not illustrated in FIG. 7). The lightguide sheet may comprise a substrate (e.g., a transparent thermoplastic such as PMMA or other acrylic), a layer of lacquer and multiple grating elements formed in the layer of lacquer that function to propagate light from the light source towards display 702; thus, illuminating display 702.

Cover layer component 716 may include a transparent substrate or sheet having an outer layer that functions to reduce at least one of glare or reflection of ambient light incident on electronic device 100. In some instances, cover layer component 716 may comprise a hard-coated polyester and/or polycarbonate film, including a base polyester or a polycarbonate, that results in a chemically bonded UV-cured hard surface coating that is scratch resistant. In some instances, the film may be manufactured with additives such that the resulting film includes a hardness rating that is greater than a predefined threshold (e.g., at least a hardness rating that is resistant to a 3$h$ pencil). Without such scratch resistance, a device may be more easily scratched and a user may perceive the scratches from the light that is dispersed over the top of the reflective display. In some examples, protective sheet 726 may include a similar UV-cured hard coating on the outer surface. Cover layer component 716 may couple to another component or to protective sheet 726 of display 702. Cover layer component 716 may, in some instances, also include a UV filter, a UV-absorbing dye, or the like, for protecting components lower in the stack from UV light incident on electronic device 100. In still other examples, cover layer component 716 may include a sheet of high-strength glass having an antiglare and/or antireflective coating.

Display 702 includes protective sheet 726 overlying an image-displaying component 728. For example, display 702 may be preassembled to have protective sheet 726 as an outer surface on the upper or image-viewing side of display 702. Accordingly, protective sheet 726 may be integral with and may overlay image-displaying component 728. Protective sheet 726 may be optically transparent to enable a user to view, through protective sheet 726, an image presented on image-displaying component 728 of display 702.

In some examples, protective sheet 726 may be a transparent polymer film in the range of 25 to 200 micrometers in thickness. As several examples, protective sheet 726 may be a transparent polyester, such as polyethylene terephthalate (PET) or polyethylene naphthalate (PEN), or other suitable transparent polymer film or sheet, such as a polycarbonate or an acrylic. In some examples, the outer surface of protective sheet 726 may include a coating, such as the hard coating described above. For instance, the hard coating may be applied to the outer surface of protective sheet 726 before or after assembly of protective sheet 726 with image-displaying component 728 of display 702. In some examples, the hard coating may include a photoinitiator or other reactive species in its composition, such as for curing the hard coating on protective sheet 726. Furthermore, in some examples, protective sheet 726 may be dyed with a UV-light-absorbing dye, or may be treated with other UV-absorbing treatment. For example, protective sheet 726 may be treated to have a specified UV cutoff such that UV light below a cutoff or threshold wavelength is at least partially absorbed by protective sheet 726, thereby protecting image-displaying component 728 from UV light.

According to some embodiments herein, one or more of the components discussed above may be coupled to display 702 using fluid optically-clear adhesive (LOCA). For example, the lightguide portion of front light component 714 may be coupled to display 702 by placing LOCA on the outer or upper surface of protective sheet 726. If the LOCA reaches the corner(s) and/or at least a portion of the perimeter of protective sheet 726, UV-curing may be performed on the LOCA at the corners and/or the portion of the perimeter. Thereafter, the remaining LOCA may be UV-cured and front light component 714 may be coupled to the LOCA. By first curing the corner(s) and/or the perimeter, the techniques effectively create a barrier for the remaining LOCA and also prevent the formation of air gaps in the LOCA layer, thereby increasing the efficacy of front light component 714. In other embodiments, the LOCA may be placed near a center of protective sheet 726, and pressed outwards towards a perimeter of the top surface of protective sheet 726 by placing front light component 714 on top of the LOCA. The LOCA may then be cured by directing UV light through front light component 714. As discussed above, and as discussed additionally below, various techniques, such as surface treatment of the protective sheet, may be used to prevent discoloration of the LOCA and/or protective sheet 726.

While FIG. 7 illustrates a few example components, electronic device 100 may have additional features or functionality. For example, electronic device 100 may also include additional data storage devices (removable and/or non-removable) such as, for example, magnetic disks, optical disks, or tape. The additional data storage media, which may reside in a control board, may include volatile and nonvolatile, removable and non-removable media implemented in any method or technology for storage of information, such as computer readable instructions, data structures, program modules, or other data. In addition, some or all of the functionality described as residing within electronic device 100 may reside remotely from electronic device 100 in some implementations. In these implementations, electronic device 100 may utilize communication interfaces 718 to communicate with and utilize this functionality.

Many of the functional units described in this specification may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of executable code may, for instance, comprise one or more physical or logical blocks of computer instructions that may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Additionally, many of the various components or modules may include elements that are labeled as inputs or outputs. In certain embodiments, such inputs and outputs may include physical aspects, for example, as a pin or lead of a semiconductor chip or discrete electrical component or as a line (e.g., pin, lead, trace, wire, node, or other conductor or conductor network) on which such an electrical signal may exist. Coupling and operative coupling between these various inputs and outputs may be effected through known methods, including direct physical electrical coupling and indirect coupling (e.g., through one or more other devices, modules, and/or mediums). Alternatively, in various embodiments, inputs and outputs may include conceptual interfaces that, for example, enable coupling between various software and/or firmware modules.

Although the subject matter has been described in language specific to structural features and/or methodological acts, it is to be understood that the subject matter defined in the appended claims is not necessarily limited to the specific features or acts described. Rather, the specific features and acts are disclosed as illustrative forms of implementing the claims.

One skilled in the art will realize that a virtually unlimited number of variations to the above descriptions are possible, and that the examples and the accompanying figures are merely to illustrate one or more examples of implementations.

The schematic flow chart diagrams included depicting various methods are generally set forth as logical flow-chart diagrams. As such, the depicted order and labeled steps are indicative of one embodiment or various embodiments of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow-chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

It will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular embodiments disclosed, but that such claimed subject matter may also include all embodiments falling within the scope of the appended claims, and equivalents thereof.

In the detailed description above, numerous specific details are set forth to provide a thorough understanding of claimed subject matter. However, it will be understood by those skilled in the art that claimed subject matter may be practiced without these specific details. In other instances, methods, apparatuses, or systems that would be known by one of ordinary skill have not been described in detail so as not to obscure claimed subject matter.

Reference throughout this specification to "one embodiment" or "an embodiment" may mean that a particular feature, structure, or characteristic described in connection with a particular embodiment may be included in at least one embodiment of claimed subject matter. Thus, appearances of the phrase "in one embodiment" or "an embodiment" in various places throughout this specification is not necessarily intended to refer to the same embodiment or to any one particular embodiment described. Furthermore, it is to be understood that particular features, structures, or characteristics described may be combined in various ways in one or more embodiments. In general, of course, these and other issues may vary with the particular context of usage. Therefore, the particular context of the description or the usage of these terms may provide helpful guidance regarding inferences to be drawn for that context.

What is claimed is:

1. An apparatus for transferring charge from a power source of an electrowetting display device to a processor of the electrowetting display device, the apparatus comprising:
   a current sensor coupled to the power source and configured to sense a present current draw on the power source by the processor;
   a frequency multiplier coupled to the current sensor and including a phase-locked loop ("PLL"), the frequency multiplier configured to generate a PLL feedback signal that is a multiple of a timing control signal of the processor, wherein the multiple is determined by the present current draw on the power source; and
   a charge pump having an input line coupled to the frequency multiplier to receive a signal corresponding to the PLL feedback signal and an output line coupled to the processor, the charge pump configured to dynamically adjust an amount of charge available at the output line for the processor based upon the signal corresponding to the PLL feedback signal.

2. The apparatus of claim 1, wherein the charge pump comprises a flying capacitor and the charge pump dynamically adjusts the amount of charge available at the output line by modifying a capacitance of the flying capacitor in relation to the signal corresponding to the PLL feedback signal.

3. The apparatus of claim 1, wherein the PLL comprises:
   a voltage controlled oscillator ("VCO") configured to generate the multiplied frequency signal at a VCO output line;
   a binary counter having a clock pulse input line coupled to the VCO output line to receive the multiplied frequency signal, the binary counter having a plurality of binary counter output lines;
   a selector configured to select one binary counter output line of the plurality of binary counter output lines based on the present current draw on the power source;

a phase detector having a first input line for receiving the timing control signal and a second input line coupled to the selected binary counter output line, the phase detector configured to output a phase signal; and a low-pass filter configured to receive the phase signal and to output the PLL feedback signal on a low-pass filter output line, wherein the VCO is configured to receive the PLL feedback signal and the low-pass filter output line is coupled to the charge pump to adjust the amount of charge available at the output of the charge pump based on the PLL feedback signal.

4. An apparatus comprising:

a current sensor configured to operatively couple to an output of a power source and sense a present current draw on the power source by at least a powered device;

a voltage converter coupled to the current sensor and having an output line configured to couple to the powered device to provide an output charge to the powered device, the voltage converter configured to adjust the output charge in relation to the sensed present current draw on the power source; and a phase-locked loop ("PLL") configured to receive a timing control signal indicative of a present operational frequency of the powered device, the PLL configured to:
  generate an increased frequency signal by increasing a frequency of the timing control signal by an amount at least partially determined by the sensed present current draw; and
  control the voltage converter to adjust the output charge based on the increased frequency signal.

5. The apparatus of claim 4, further comprising:

at least one comparator coupled to the charge sensor and configured to compare a signal from the charge sensor indicative of the present current draw on the power source to at least one current draw reference value; and at least one logic module configured to output a binary value corresponding to an output of the at least one comparator module, the binary value corresponding to the sensed present current draw.

6. The apparatus of claim 4, further comprising:

a frequency multiplier configured to:
  receive a frequency signal indicative of the present operational frequency of the powered device;
  increase a frequency of the frequency signal by an amount at least partially determined by a value corresponding to the present current draw on the power source to create an increased frequency signal; and
  control operation of the voltage converter to adjust the output charge based on the increased frequency signal.

7. An apparatus comprising:

a current sensor configured to operatively couple to an output of a power source and sense a present current draw on the power source by at least a powered device; and a voltage converter coupled to the current sensor and having an output line configured to couple to the powered device to provide an output charge to the powered device, the voltage converter configured to adjust the output charge in relation to the sensed present current draw on the power source, wherein the voltage converter further comprises a charge pump circuit including an adjustable flying capacitor, the charge pump circuit configured to adjust a capacitance of the adjustable flying capacitor to adjust the output charge.

8. The apparatus of claim 4, wherein the PLL comprises a phase detector and a low-pass filter configured to output a feedback signal to the voltage converter to adjust the output charge.

9. The apparatus of claim 8, wherein the PLL further comprises a voltage controlled oscillator ("VCO") and a binary counter having a clock pulse input line coupled to an output line of the VCO, the binary counter having a binary counter output line coupled to an input line of the phase detector.

10. The apparatus of claim 8, wherein the voltage converter further comprises a charge pump coupled to the PLL, the charge pump including a voltage controlled capacitor configured as a flying capacitor of the charge pump, the voltage controlled capacitor configured to vary a capacitance based on the feedback signal from the PLL.

11. An apparatus comprising:

a current sensor configured to operatively couple to an output of a power source and sense a present current draw on the power source by at least a powered device; and a voltage converter coupled to the current sensor and having an output line configured to couple to the powered device to provide an output charge to the powered device, the voltage converter configured to adjust the output charge in relation to the sensed present current draw on the power source, wherein the powered device comprises a processor of an electrowetting display ("EWD"), a present operational frequency of the processor is determined by a timing control signal, and the voltage converter is configured to adjust the output charge in relation to the timing control signal.

12. A method comprising:

sensing by a current sensor a present current draw on a power source by a powered device;

adjusting by a voltage converter an output charge of the voltage converter in relation to the sensed present current draw on the power source, the output charge provided at least to the powered device receiving a frequency signal indicative of a present operational frequency of the powered device at a phase-locked loop ("PLL");

generating by the PLL an increased frequency signal by increasing the frequency signal by an amount at least partially determined by the sensed present current draw; and adjusting by the voltage converter the output charge based on the increased frequency signal.

13. A method comprising:

sensing by a current sensor a present current draw on a power source by a powered device;

adjusting by a voltage converter an output charge of the voltage converter in relation to the sensed present current draw on the power source, the output charge provided at least to the powered device;

receiving by a frequency multiplier a frequency signal indicative of a present operational frequency of the powered device;

increasing by the frequency multiplier the frequency signal by a value corresponding to the present current draw to create an increased frequency signal; and adjusting by the voltage converter the output charge based on the increased frequency signal.

14. The method of claim 12, wherein adjusting by the voltage converter the output charge comprises adjusting a capacitive of a flying capacitor of a charge pump.

15. The method of claim 12, further comprising:
receiving as a clock pulse input of a binary counter an output of a voltage controlled oscillator ("VCO") of the PLL to generate the increased frequency signal; and
receiving at an input to a phase detector of the PLL an output of the binary counter selected based on the sensed present current draw.

16. The method of claim 12, wherein adjusting by the voltage converter the output charge based on the increased frequency signal comprises adjusting a component of the voltage converter based on a feedback signal provided to an input of a voltage controlled oscillator ("VCO") of the PLL.

17. The method of claim 16, wherein adjusting a component of the voltage converter comprises adjusting a voltage controlled capacitor operating as a flying capacitor of the voltage converter.

18. The method of claim 13, further comprising operating a switching device of a charge pump of the voltage converter at a switching frequency corresponding to a frequency signal indicative of a present operational frequency of the powered device.

19. The apparatus of claim 11, further comprising:
at least one comparator coupled to the charge sensor and configured to compare a signal from the charge sensor indicative of the present current draw on the power source to at least one current draw reference value; and
at least one logic module configured to output a binary value corresponding to an output of the at least one comparator module, the binary value corresponding to the sensed present current draw.

20. The apparatus of claim 11, further comprising:
a frequency multiplier configured to:
receive a frequency signal indicative of a present operational frequency of the powered device;
increase a frequency of the frequency signal by an amount at least partially determined by a value corresponding to the present current draw on the power source to create an increased frequency signal; and
control operation of the voltage converter to adjust the output charge based on the increased frequency signal.

21. The apparatus of claim 11, wherein the voltage converter further comprises a charge pump circuit including an adjustable flying capacitor, the charge pump circuit configured to adjust a capacitance of the adjustable flying capacitor to adjust the output charge.

22. The apparatus of claim 11, further comprising:
a phase-locked loop ("PLL") configured to receive the timing control signal indicative of the present operational frequency of the powered device, the PLL configured to:
generate an increased frequency signal by increasing a frequency of the timing control signal by an amount at least partially determined by the sensed present current draw; and
control the voltage converter to adjust the output charge based on the increased frequency signal.

23. The apparatus of claim 22, wherein the PLL comprises a phase detector and a low-pass filter configured to output a feedback signal to the voltage converter to adjust the output charge.

24. The apparatus of claim 23, wherein the PLL further comprises a voltage controlled oscillator ("VCO") and a binary counter having a clock pulse input line coupled to an output line of the VCO, the binary counter having a binary counter output line coupled to an input line of the phase detector.

25. The apparatus of claim 23, wherein the voltage converter further comprises a charge pump coupled to the PLL, the charge pump including a voltage controlled capacitor configured as a flying capacitor of the charge pump, the voltage controlled capacitor configured to vary a capacitance based on the feedback signal from the PLL.

* * * * *